United States Patent [19]
Jancsek et al.

[11] Patent Number: 6,036,290
[45] Date of Patent: Mar. 14, 2000

[54] SEISMIC SUBFRAME FOR ELECTRICAL ENCLOSURE

[75] Inventors: John J. Jancsek, Blaine; Creighton R. Thompson, Chaska; Robert G. Lau, Anoka; Todd J. Mickley, Andover; Erik E. Emstad, Lauderdale, all of Minn.

[73] Assignee: Hoffman Enclosures, Inc., Anoka, Minn.

[21] Appl. No.: 09/042,270

[22] Filed: Mar. 13, 1998

[51] Int. Cl.[7] .................................................. A47B 47/00
[52] U.S. Cl. .................................... 312/265.4; 312/223.3; 312/265.3
[58] Field of Search .............................. 312/265.1, 265.2, 312/265.3, 265.4, 265.5, 265.6, 223.3, 304, 351; 211/26, 191

[56] References Cited

U.S. PATENT DOCUMENTS

| | | |
|---|---|---|
| D. 131,217 | 1/1942 | Braun . |
| D. 197,050 | 12/1963 | Orenstein . |
| D. 292,171 | 10/1987 | Berg . |
| D. 332,904 | 2/1993 | Plummer et al. . |
| D. 343,347 | 1/1994 | Lau et al. . |
| 3,034,844 | 5/1962 | Anderson et al. . |
| 3,404,931 | 10/1968 | Fall et al. . |
| 3,563,627 | 2/1971 | Whipps . |
| 4,631,937 | 12/1986 | Debus et al. . |
| 4,997,240 | 3/1991 | Schmalzl et al. ..................... 312/265.4 |
| 5,228,762 | 7/1993 | Maascrier ......................... 312/265.1 X |
| 5,250,752 | 10/1993 | Cutright ............................ 312/265.4 X |
| 5,639,150 | 6/1997 | Anderson et al. .................... 312/265.3 |
| 5,695,263 | 12/1997 | Simon et al. ..................... 312/265.1 X |
| 5,749,476 | 5/1998 | Besserer et al. .......................... 211/26 |
| 5,788,348 | 8/1998 | Ramachandran et al. ........... 312/223.1 |
| 5,848,500 | 12/1998 | Kirk ................................. 312/265.1 X |

FOREIGN PATENT DOCUMENTS 196 15 759 A1 10/1997 Germany .

OTHER PUBLICATIONS

Exhibit A, Hoffman Engineering Company Specifier's Guide, 1995–1996, p. 502, showing lock kits for enclosures and junction boxes.

Exhibit B, Hoffman Engineering Company Specifier's Guide, 1995–1996, pp. 574–575 showing handles, latches and clamps for use on Hoffman custom enclosures.

Exhibit C, Hoffman Engineering Company Specifier's Guide, 1995–1996, p. 30–, showing door accessories.

Exhibit D, Cover page of a DECO brochure, dated Apr., 1993, showing a latch handle.

*Primary Examiner*—Peter M. Cuomo
*Assistant Examiner*—Hanh V. Tran
*Attorney, Agent, or Firm*—Merchant & Gould P.C.

[57] ABSTRACT

An electrical enclosure includes a frame and a seismic subframe. The seismic subframe includes vertical frame members interconnecting with braces at the top and bottom and opening at the front and rear of the enclosure. The assembly mounts to the rectangular frame of the enclosure. Grid straps extend from front to rear to connect the assemblies and provide additional bracing. Front and rear panels include gusset type braces at the corners mounted to the panels that engage inner edges of the framework to provide positioning as well as support.

23 Claims, 10 Drawing Sheets

SEISMIC SUBFRAME FOR ELECTRICAL ENCLOSURE

BACKGROUND

1. Field of the Invention

The present invention relates to electrical enclosures and frames, and in particular, to an electrical enclosure having a seismic subframe.

2. Prior Art

Electrical enclosure systems such as are used in connection with large or small electrical switchboard systems are commonly used to house a plurality of interior mounting boards for holding electrical components and other accessories for a wide variety of purposes. Manufacturing of such enclosures requires adaptability to various customer demands while providing an enclosure that is versatile, space efficient, and has an easily accessible interior. It is important that such enclosures have easily removable subpanel mounting boards that can be installed, removed or repositioned easily to minimize time and labor. Enclosures should be adaptable to multiple configurations and be inexpensive to manufacture. A sample of such an enclosure is shown in U.S. Pat. No. 5,292,189 to Lau et al. The base sections of the enclosure form a continuous rectangular guide channel around the inner periphery of the enclosure. In opposite parallel channel segments are received a pair of channel followers that are connected to opposite lower corners of the mounting board. The system provides a highly versatile and efficient enclosure and mounting system.

It can be appreciated however, that although such enclosures and systems perform very well in meeting normal design criteria, higher standards must be met in earthquake prone areas. Equipment used in earthquake zones must be able to meet the requirements for network building systems as outlined in Section 4.4 of the October, 1995 issue of Bellcore Standard GR-63-CORE. While prior enclosures and frames have been successful in providing flexible enclosures with easy accessibility, such systems may not meet the tougher earthquake requirements as outlined in the Bellcore Standard. The framework should be constructed to sustain earthquake equivalent forces without permanent structural or mechanical damage while also minimizing the deflection of the frame during such situations. In addition, it is advantageous for the framework to be a solid welded construction that mounts to an existing frame.

An example of a seismic frame is shown in German Patent DE19615759A1. The seismic frame includes various supports and braces which attach to the existing framework. However, the elements bolt onto the existing framework rather than weld on for added rigidity. Moreover, the various pieces extend between upright frame sections and block some of the opening at the front and rear of the framework, decreasing accessibility. In addition, the design may not meet all criteria for earthquake prone zones. The bolted on braces do not provide any bracing from the door or rear panel of the enclosure to the frame.

It can be seen that a new and improved cabinet and frame is needed that provides access and versatility as well as meeting the physical and functional performance requirements for use in earthquake environments. The present invention addresses these as well as other problems associated with electrical enclosures and frameworks.

SUMMARY OF THE INVENTION

The present invention is directed to an electrical enclosure and frame and in particular, to an electrical enclosure and frame with a seismic subframe. The electrical enclosure includes a rectangular frame having upright elements and upper and lower cross sections forming a substantially rectangular frame. Frame element designs vary, but generally include rectangular guide channels as well as multiple mounting orifices for attaching racks, enclosure panels and various other components and accessories.

To meet the criteria for the enclosure to be used in earthquake prone zones, it is necessary to provide an additional support to the enclosure frame. It is an object of the present invention to provide additional support to meet earthquake criteria for enclosures while maintaining versatility, accessibility to the interior of the electrical enclosure and ease of manufacture. The seismic subframe includes vertical subframe elements that form a rectangular guide channel and are mounted to the frame of the electrical enclosure. Subframe vertical elements are mounted adjacent the existing vertical elements of the frame or are moved inward remote from the vertical elements. The cross members of the top and bottom provide bracing at the front and back of the enclosure and form a subframe assembly. Attachment between the front and rear subframe assemblies is provided by grid straps. Grid straps are typically widened rectangular "C" channel members having mounting orifices spaced along the sides, top and bottom of the rectangular channel. The grid straps are typically spaced apart from the top and the bottom members and insert into cutouts formed in a flange of the subframe elements.

In addition to the seismic subframe that may attach to the normal frame, additional support can also be provided by front and rear mounting panel braces at the front door panel and rear panel of the enclosure. Four braces are attached to each of the front and rear panels, with the braces mounted to the panels, so that if the panels are removed, access is not limited by the braces. The panel braces are typically placed near each of the four corners of the panels in a position to engage the interior edges of the top and bottom inside corner frame sections. The edges of the panel braces are at right angles to one another so that movement of the frame members that are engaged is limited by the engagement with the panel braces. The braces typically mount on door bars so that the plane of the braces is parallel to and spaced apart from the plane of the door to engage the edges of the enclosure frame members. The front and rear panel braces may be used separately or in conjunction with the seismic subframe assemblies.

These features of novelty and various other advantages which characterize the invention are pointed out with particularity in the claims annexed hereto and forming a part hereof. However, for a better understanding of the invention, its advantages, and the objects obtained by its use, reference should be made to the drawings which form a further part hereof, and to the accompanying descriptive matter, in which there is illustrated and described a preferred embodiment of the invention.

BRIEF DESCRIPTION OF THE DRAWINGS

Referring now to the drawings, wherein like reference letters and numerals indicate corresponding structure throughout the several views.

DETAILED DESCRIPTION OF THE PREFERRED EMBODIMENT

Figure 1:
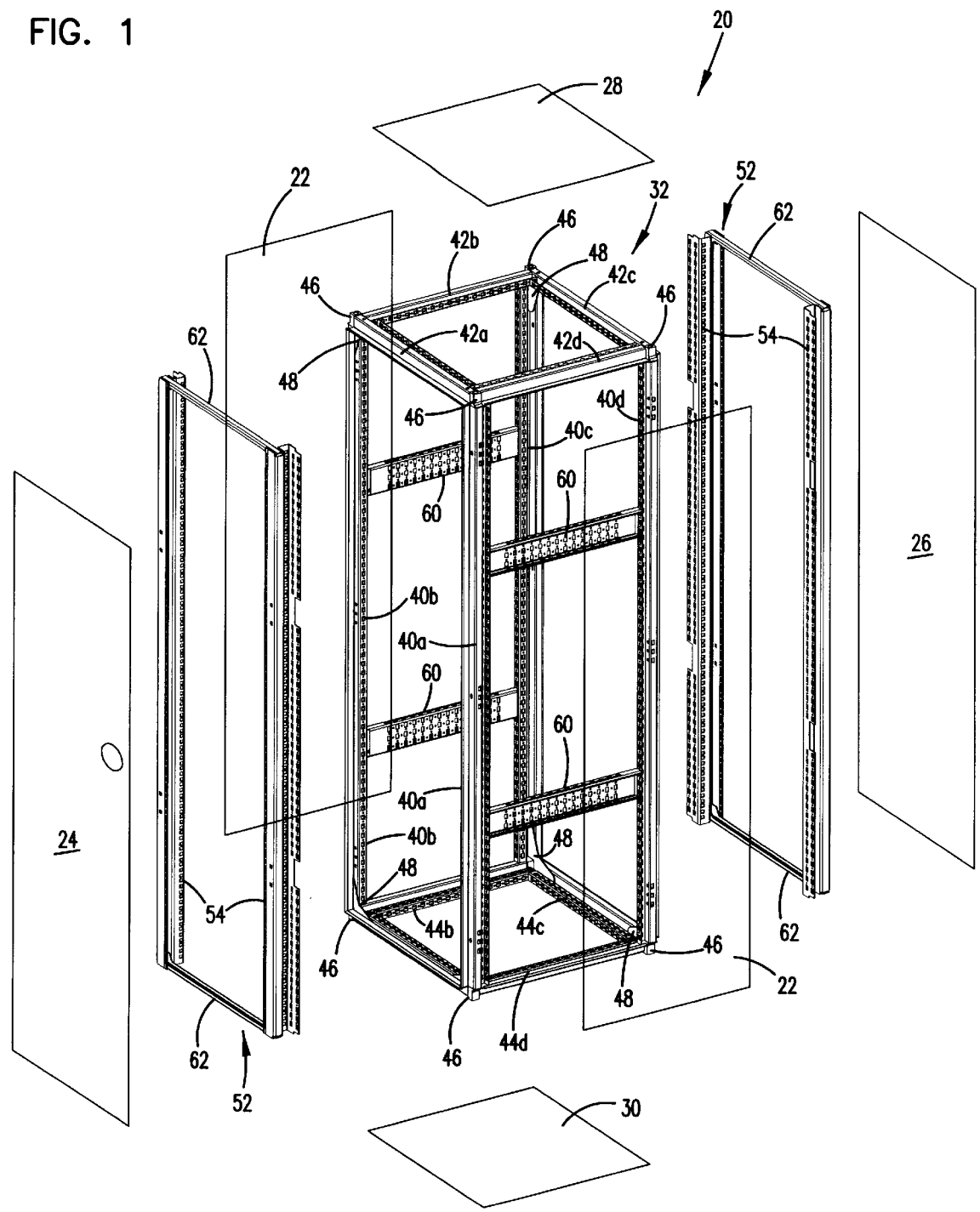
FIG. 1 shows a partially exploded perspective view of an electrical enclosure according the principles of the present invention.

Referring now to the drawings, and in particular to FIG. 1, there is shown an electrical enclosure, generally designated 20. The enclosure 20 includes a frame 32 supporting side panels 22, a front door panel 24 and rear wall panel 26, as well as a top panel 28 and bottom base 30. Such an enclosure may take on a variety of sizes and proportions and supports electrical equipment and accessories that are typically mounted on racks supported on the frame 32.

Figure 2:
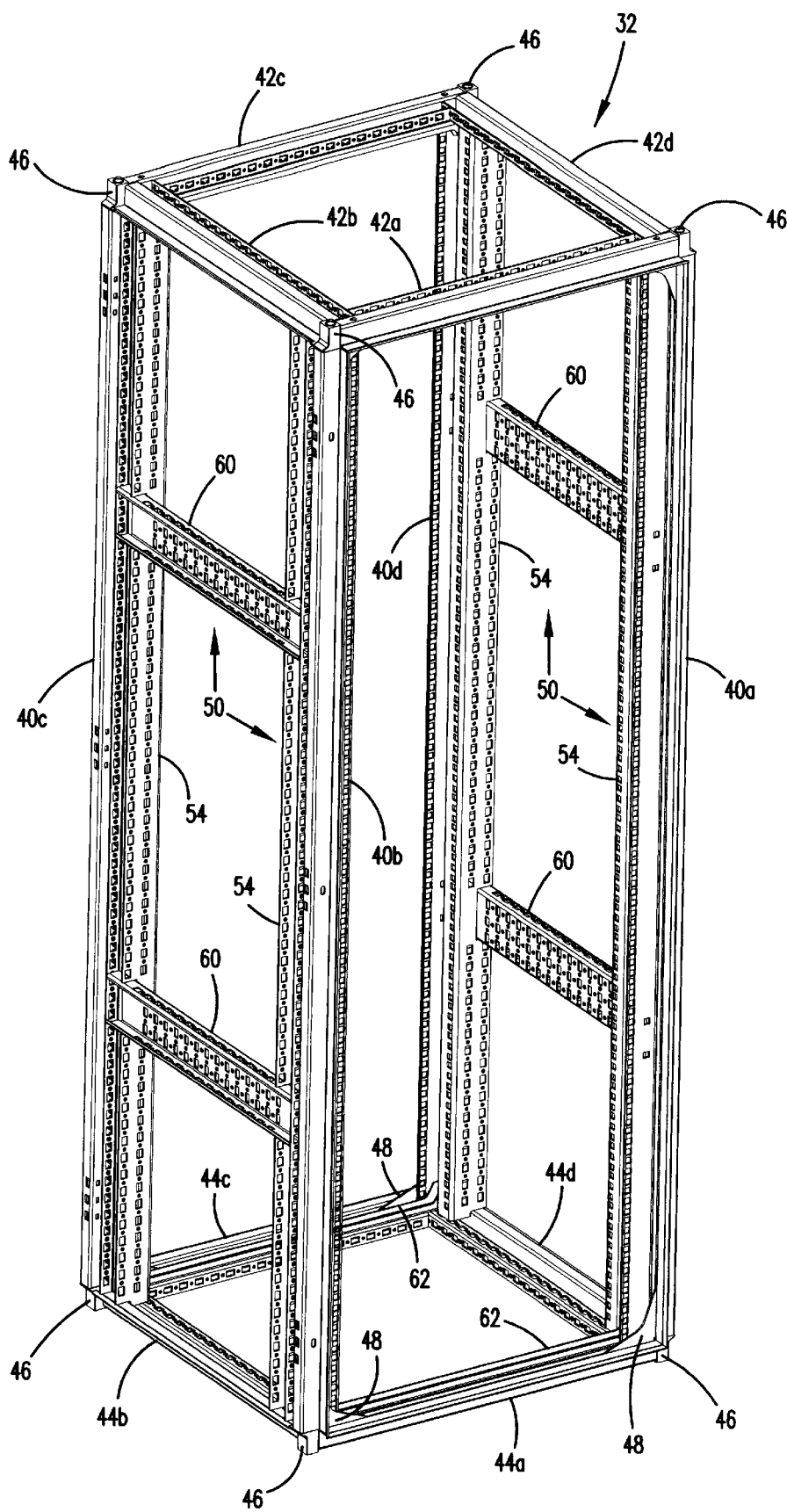
FIG. 2 shows a perspective view of a frame and subframe structure for the electrical enclosure shown in FIG. 1.
Figure 9:
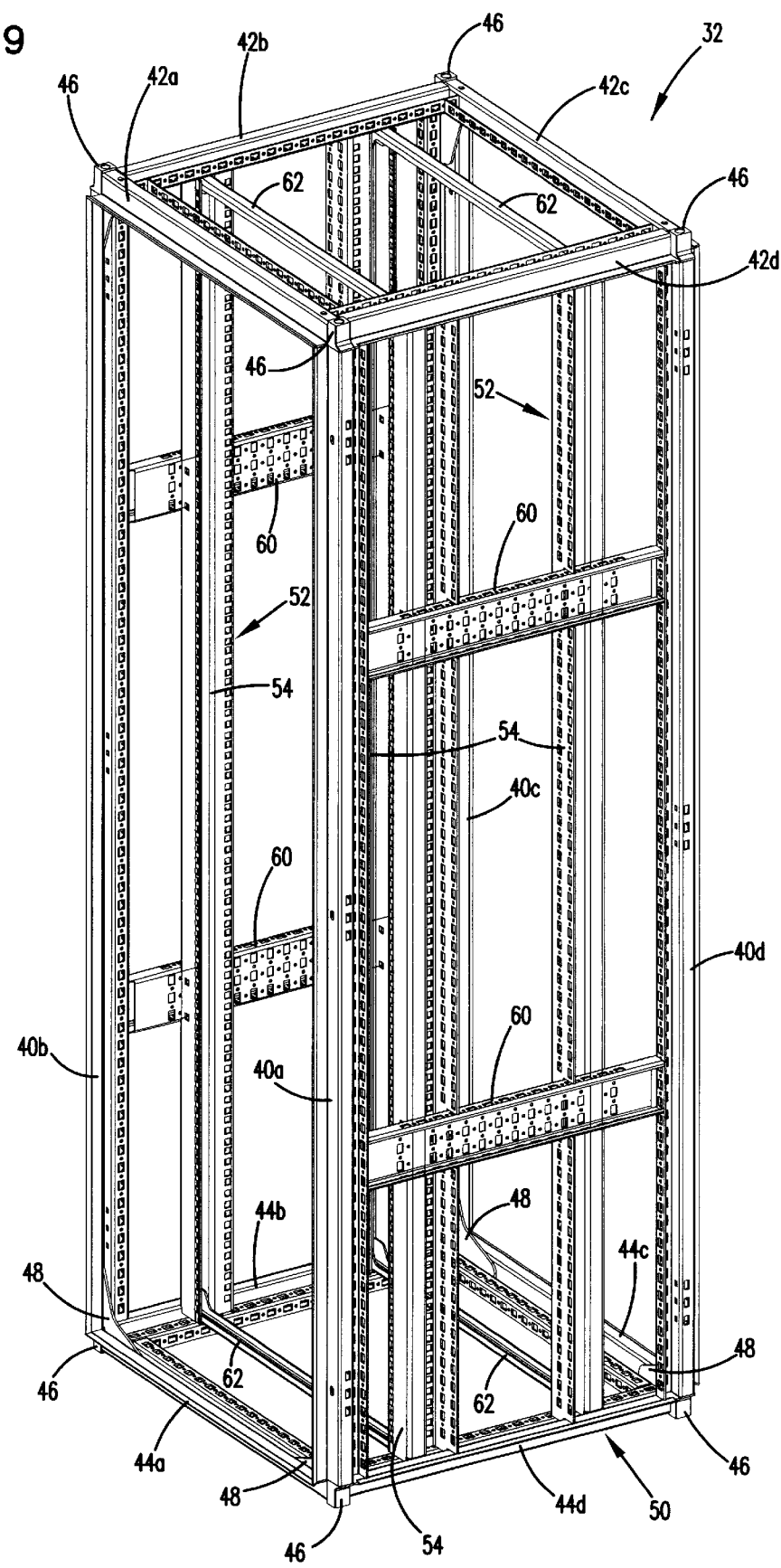
FIG. 9 shows a perspective view of an electrical enclosure frame and subframe structure with the subframe assemblies mounted remote from the vertical frame elements; and, FIG. 10–14 show end elevational views of alternate embodiments of the subframe element shown in FIG. 3.

As shown most clearly in FIGS. 1, 2 and 9, the enclosure frame 32 generally includes corner frame sections 40a, 40b, 40c and 40d. In addition, upper frame cross sections 42a, 42b, 42c and 42d as well as lower frame cross sections 44a, 44b, 44c and 44d form a generally rectangular framework. The various sections 40, 42 and 44, connect to each other at their corners and with mounting blocks 46 configured for accepting the various frame sections 40, 42 and 44. The frame sections 40, 42 and 44 may have several shapes, but typically form a rectangular guide channel and have mounting orifices spaced along the length of the sections. Sections 40, 42 and 44 are welded in a preferred embodiment. The mounting blocks 46 may also include tapped holes for attaching other elements. The frame 32 may also have frame gussets 48 attached at the upper and lower rectangular guide channels to provide additional support to the frame 32.

Figures 3A, 3B:
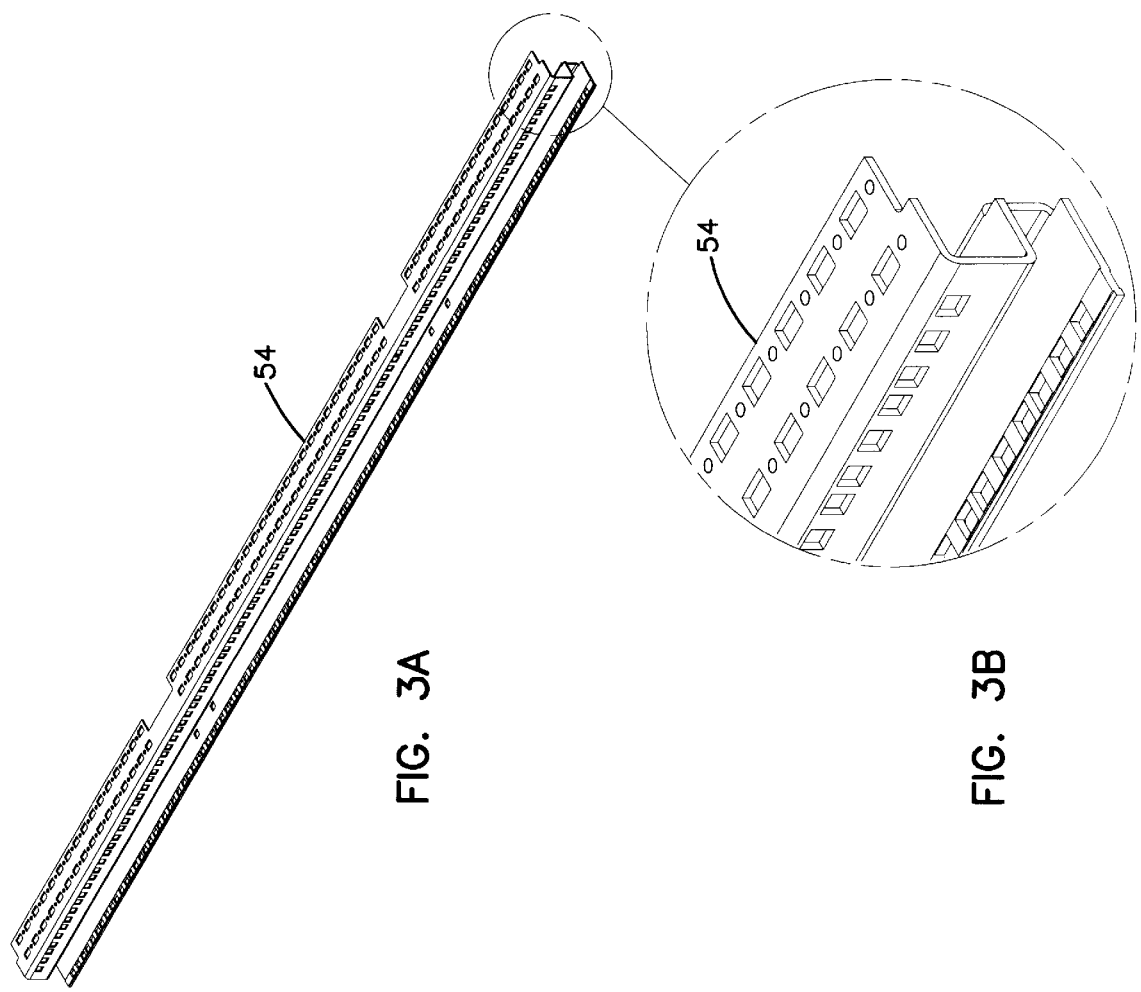
FIGS. 3A and 3B show a perspective view of a subframe element for the structure shown in FIG. 2.
Figure 4:
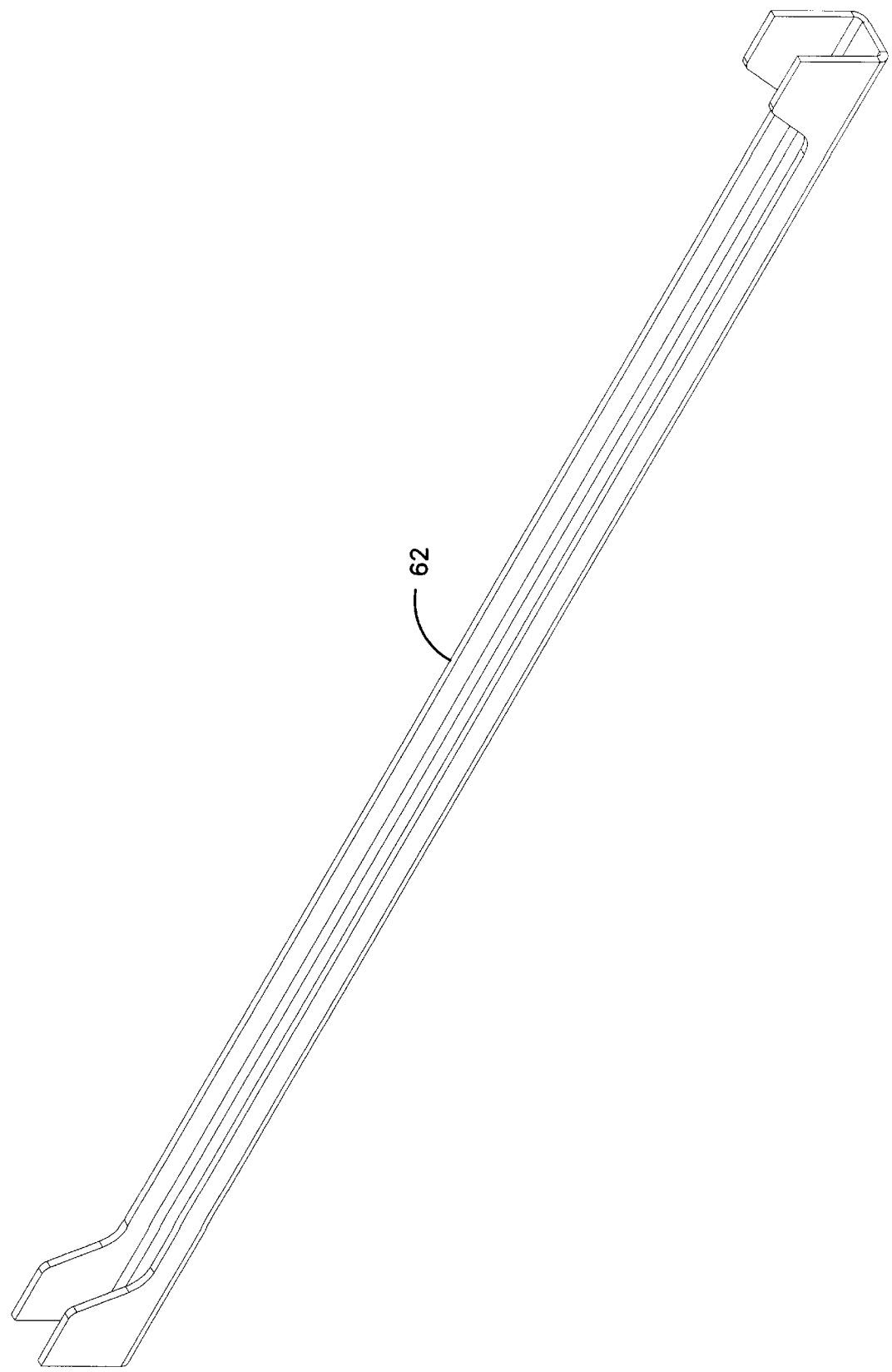
FIG. 4 shows a perspective view of a subframe cross brace for the structure shown in FIG. 2.

Referring now to FIGS. 3A and 3B, there is shown a rack angle or subframe element 54 for a seismic subframe 50 for the enclosure 20. The subframe 50 shown in FIGS. 1, 2 and 9 provides additional support and bracing for the frame 32 while maintaining versatility and accessibility for the enclosure 20. The subframe 50 has one or more subframe assemblies 52 that each include two vertical subframe elements 54. Each elongated frame element 54 includes a profile that forms a rectangular guide channel and includes a flange extending from one side. As explained hereinafter, other embodiments may include additional flanges or extended portions. The subframe elements 54 include mounting orifices spaced along the various surfaces and extending along the length of each of the elements 54. This provides for highly versatile mounting of the subframe elements 54 to the frame 32 as well as accepting various accessories and racks to be mounted onto the subframe 50. Each vertical element 54 also includes a cutout, as shown most clearly in FIG. 3A, for accepting grid straps 60. Mounting at the top and bottom of each subframe assembly 52 are braces 62, shown in FIG. 4. Each brace 62 forms a channel type profile and mounts onto the front and rear upper cross frame sections 42 and lower cross frame sections 44 of the frame 32. The braces 62 include gussets at the ends thereof and a rectangular channel formed along its length. The braces 62 mount at the very top and bottom so that the front and rear faces of the subframe 52 remain substantially open for inserting racks and accessories as well as providing access to the various components within the enclosure 20.

Figure 5:
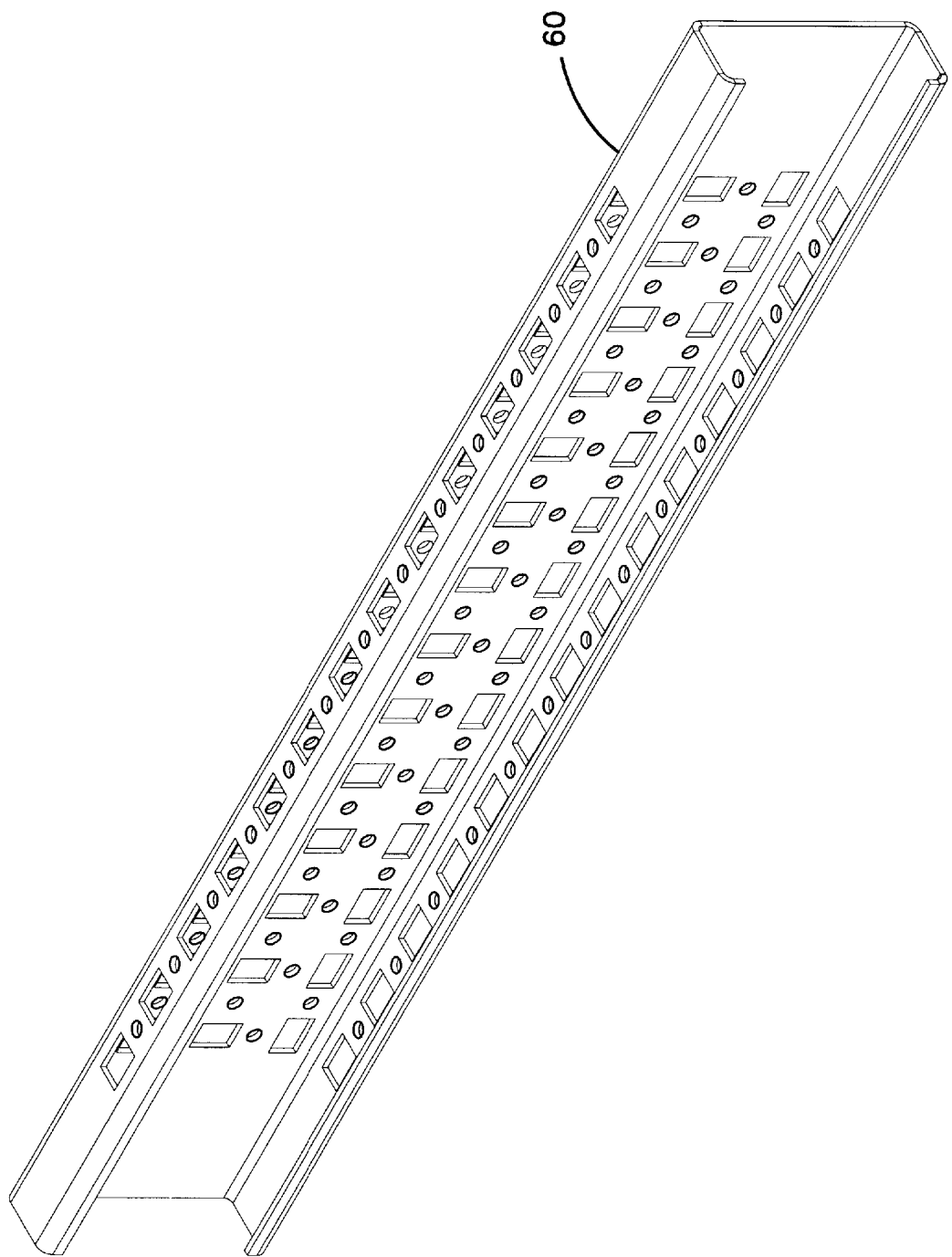
FIG. 5 shows a perspective view of a grid strap for the structure shown in FIG. 2.

As shown in FIG. 5, the grid straps 60 are C channel-type members that have mounting orifices spaced along all surfaces to provide versatility for attaching various accessories and components as well as mounting to the subframe elements 54. The grid straps 60 mount to the subframe vertical members 54 at the cutouts, as shown most clearly in FIG. 2. The grid straps 60 connect the rectangular front and rear subframe assemblies 52 to provide additional support and bracing to the enclosure frame 32 from front to back.

As shown in FIG. 9, the subframe 50 may include subframe assemblies 52 that are remote from the vertical corner frame sections 40a–d of the frame 32. In some configurations and applications, it may be advantageous to have the subframe assemblies 52 remote from the frame 32 for mounting or bracing needs and requirements. The subframe assemblies 52 may be moved anywhere along the upper cross frame sections 42, lower cross frame sections 44, and the grid straps 60 to provide added bracing. It can also be appreciated that although two such subframe assemblies 52 are shown, more than two of such assemblies may be mounted for providing added bracing and support.

Figure 6:
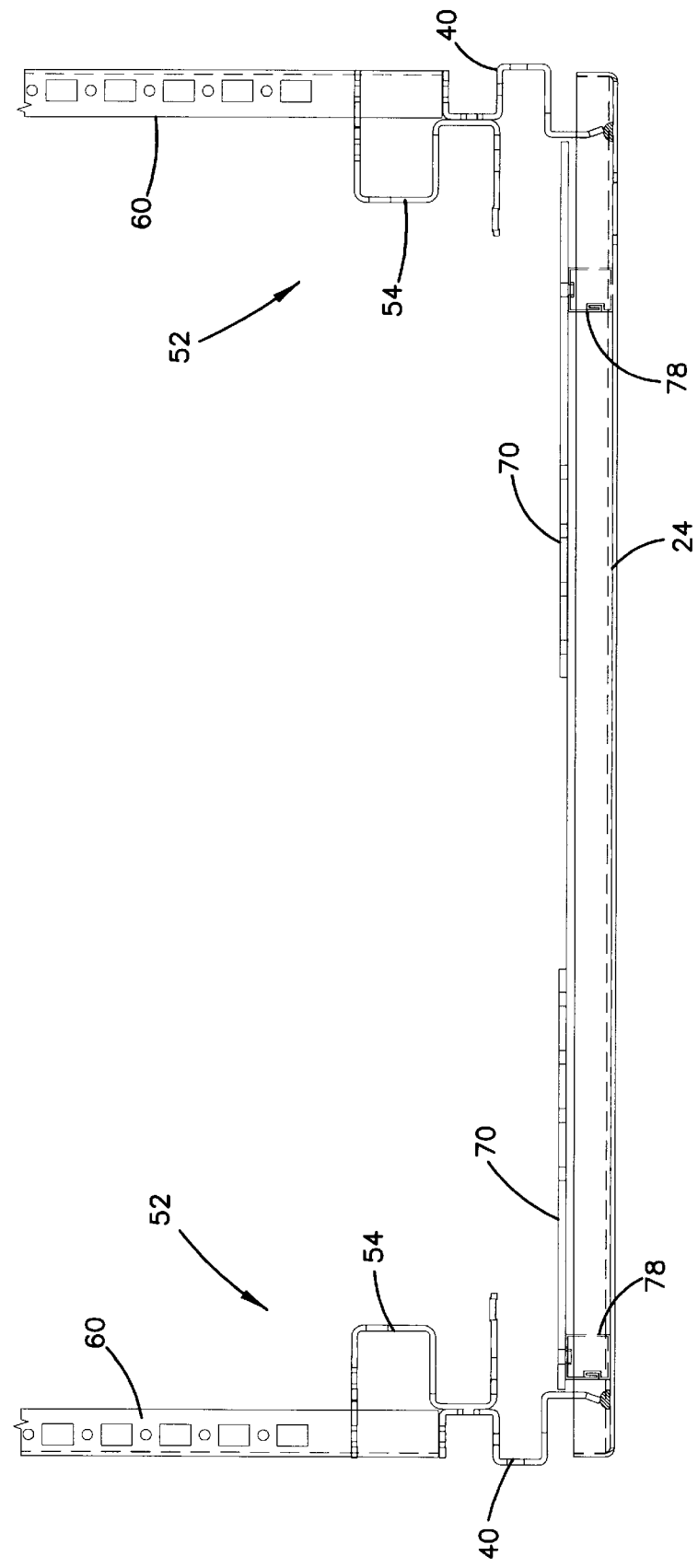
FIG. 6 shows a top plan view of the structure shown in FIG. 2 with a panel brace.

Referring now to FIG. 6, there is shown the interface between the subframe 50 and the frame 32. Each vertical subframe member 54 welds to the corresponding corner frame section 40 with the rectangular guide channels opposing one another. This configuration provides a very stable frame 32 with improved support and rigidity over an enclosure 20 without a subframe 50. The grid straps 60 attach to and extend between the front and rear corner frame sections 40 and connect to the inner side of the corner frame sections 40 to provide bracing intermediate the upper and lower cross frame sections 42 and 44.

Figure 7:
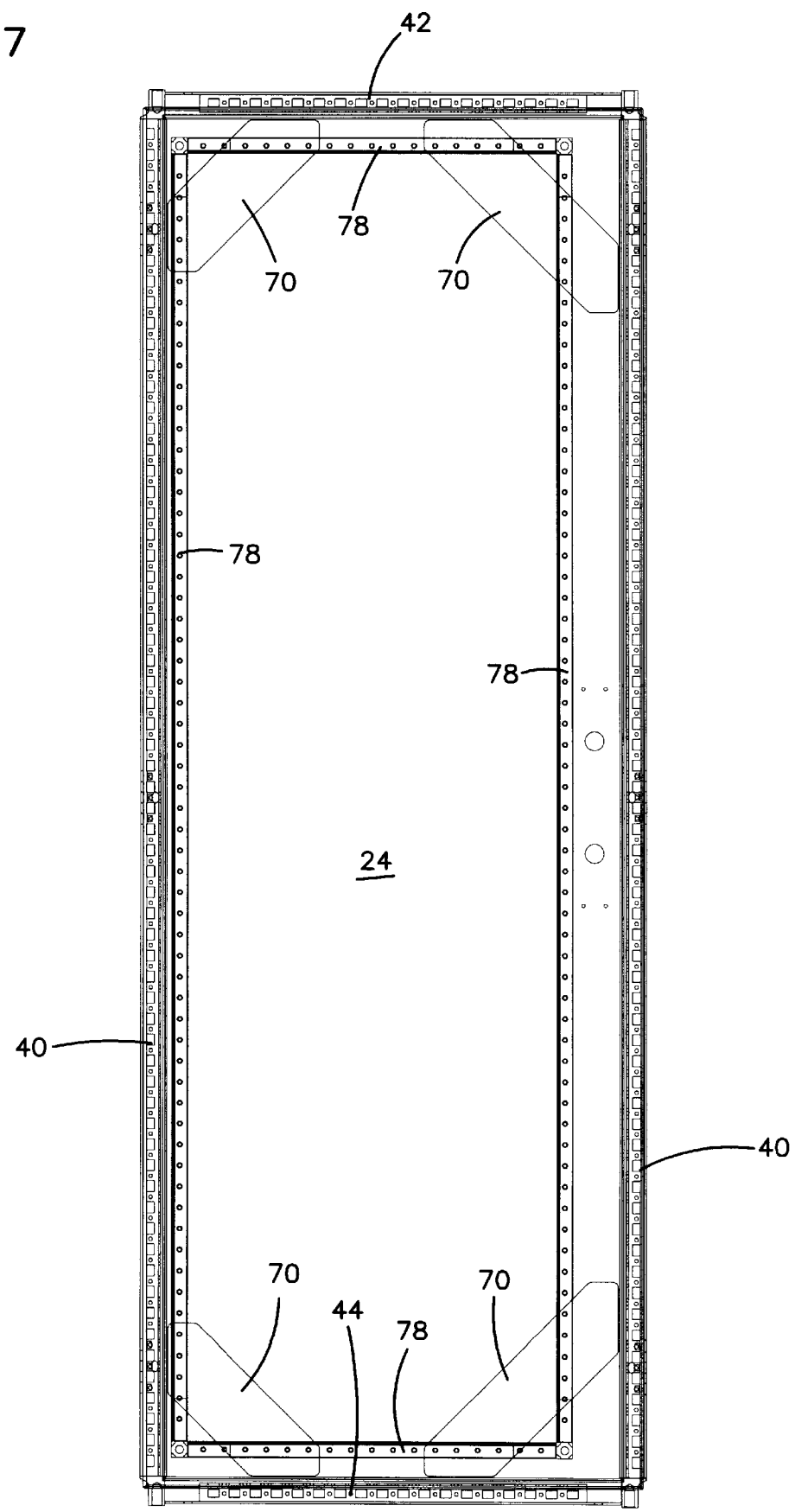
FIG. 7 shows an elevational view of the frame engaging the panel brace shown in FIG. 6.
Figure 8:
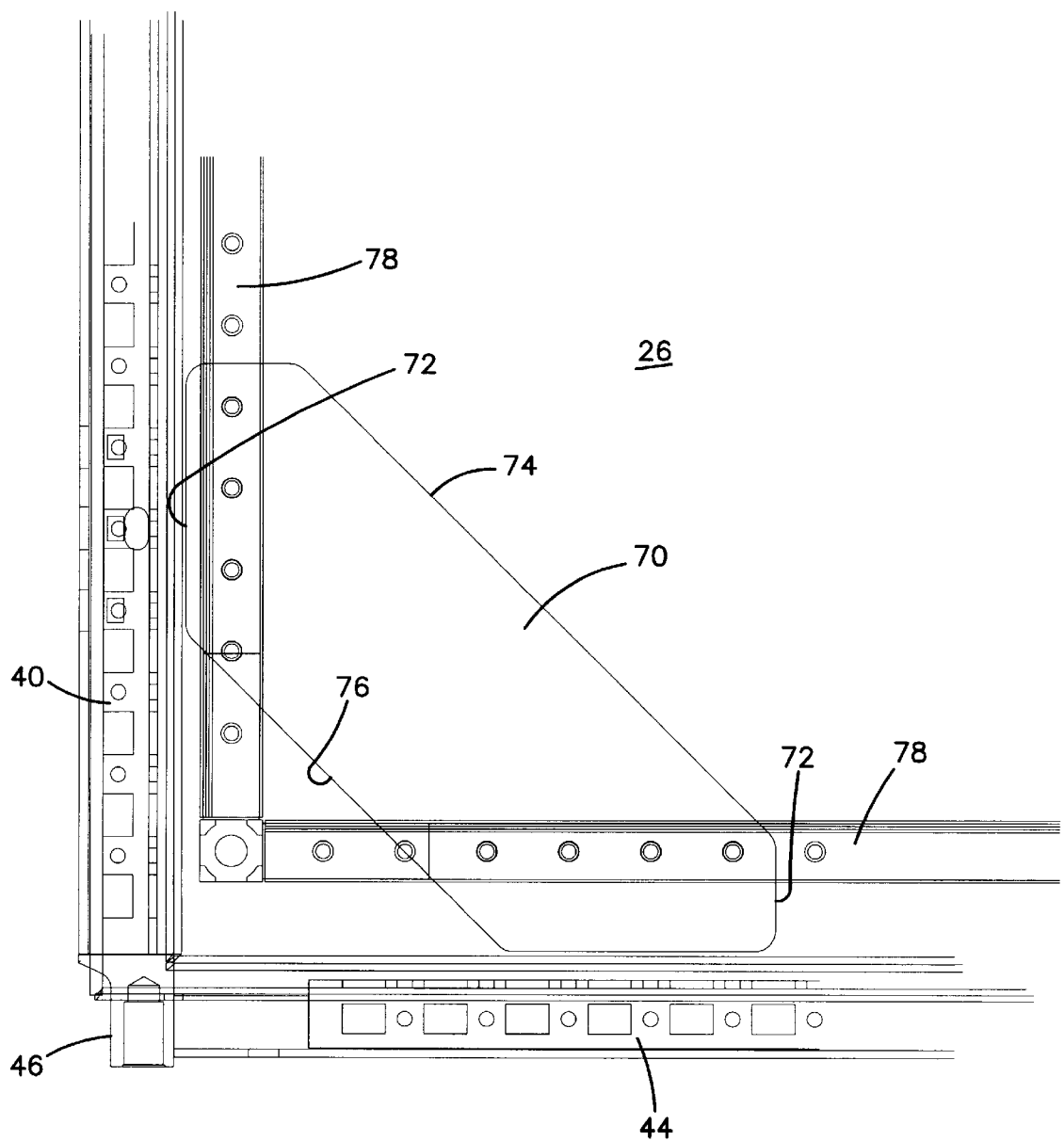
FIG. 8 shows a detailed elevational view of a panel brace as shown in FIG. 6 mounted to a rear panel and engaging the enclosure frame.

As it is desirable to leave the front and rear planes of the enclosure 20 open for access, it is more difficult to provide additional bracing along the front and rear. However, it can be appreciated that the front door panel 24 and rear panel 26 can act as additional bracing with the frame 32. As shown in FIG. 7, a panel brace 70, may be mounted to a bar assembly 78 on the front door panel 24 or on the rear panel 26, as shown in FIG. 8. The panel brace 70 includes an inner surface 74 and outer surface 76 and end surfaces 72 that engage the frame 32 to provide additional bracing to the frame 32. It can be appreciated that although the panel braces 70 have a substantially trapezoidal shape in the embodiment shown, other configurations are possible that provide engagement and support to the top and sides of the frame 32. As the panel braces 70 are mounted onto a bar assembly 78 on the front door panel 24 or rear panel 26, when the door panel 24 is open or removed or the rear panel 26 is removed, the rectangular opening mounted by the frame 32 at the front and rear of the enclosure 20 is still completely open, providing easy access to the interior. However, as shown in FIGS. 6 and 8, when the rear panel 26 is attached or the door panel 24 is closed, the panel braces 70 automatically engage the frame 32 at the interior of the corners. As shown in FIG. 6, the panel braces 70 are parallel to the panels 24 and 26 and spaced inward for automatic engagement. In addition, the position of the panel braces 70 provides self positioning for the door panel 24 and rear panel 26. As shown in FIG. 7, to accommodate a door latch, the braces 70 at the edge nearer the latch may be longer, as the vertical bar of the bar assembly 78 must be moved in from the door edge to receive the latch assembly.

Figure 10:
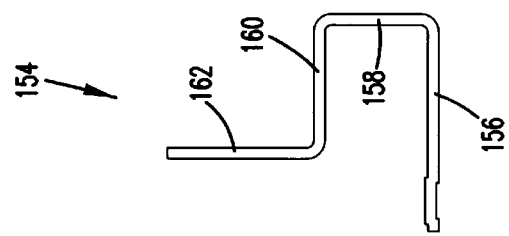

Referring now to FIGS. 10–14, there are shown various embodiments of the subframe vertical sections 54. As shown in FIG. 10, vertical frame member 154 includes planar portions 156, 158 and 160 forming a rectangular guide channel. The planar portion 156 extends slightly outward and has an offset along its length to provide for mounting flexibility. A flange 162 extends outward from the end of the planar portion 160 at a right angle from planar portion 160.

Figure 11:
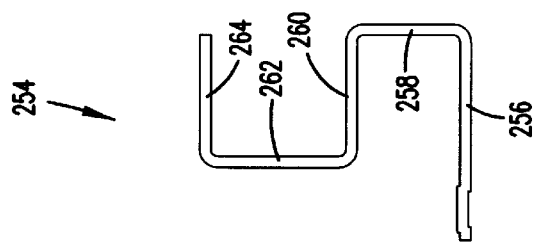

In FIG. 11, vertical section 254 includes planar portions 256, 258 and 260 forming a rectangular guide channel and also includes a flange 262 extending perpendicular to the planar portion 260. However, an additional flange 264 extends from the outer end of the flange 262 and back toward the planar portion 258 to give a rectangular "S" shaped profile.

Figure 12:
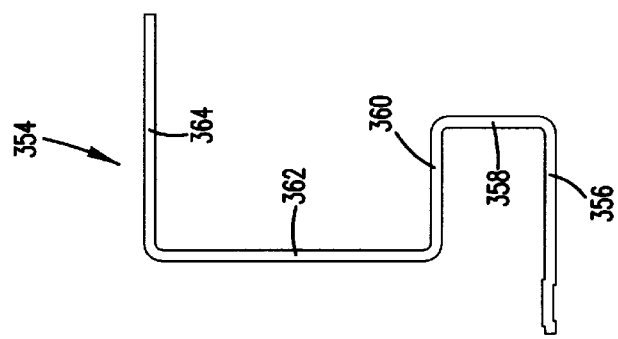

In FIG. 12, a subframe element 354 includes planar portions 356, 358, 360, 362 and 364 corresponding to the portions shown in FIG. 11. However, portions 362 and 364 are elongated to provide a different profile for greater mounting flexibility.

Figure 13:
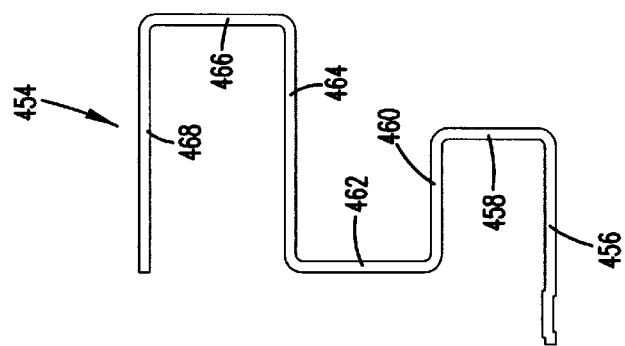

As shown in FIG. 13, subframe element 454 includes planar portions 456, 458, 460, 462, and 464. In addition, an "L" shaped member is added with planar portions 466 and 458 forming a third rectangular channel opening to the same direction as the rectangular channel formed by surfaces 456, 458 and 460. The planar portion 464 extends backward beyond the plane of planar portion 458 so that the channel formed by the portions 464, 466 and 468 is deeper than the channel formed by planar portions 456, 458, and 460.

Figure 14:
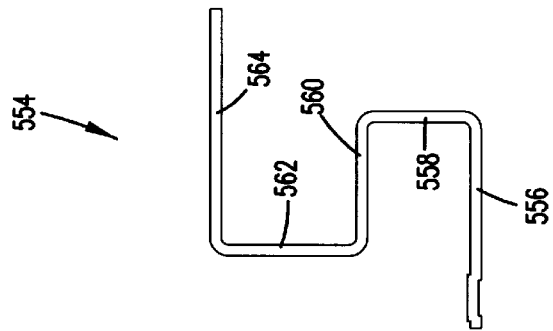

As shown in FIG. 14, another embodiment of a subframe element 554 includes planar portions 556, 558, 560, 562 and 564. The profile of element 554 is similar to that of element 254 except the portion 564 extends beyond the planar portion 558.

It can be appreciated that the present invention provides for combinations of the elements 154, 254, 354, 454, and 554, with identical frames 32. The various subframe elements 154, 254, 354, 454 and 554 are each interchangeable for mounting with grid straps 60 and braces 62. Moreover, the seismic subframe 50 and various frame elements may be used in combination with the panel braces 70. The present invention provides added rigid bracing and support for a more rigid frame which meets the design criteria for earthquake environments. It can be appreciated that the additional support and bracing limits deformation and misalignment should an earthquake strike. This provides additional protection for the electrical equipment and accessories within the enclosure.

It is to be understood, however, that even though numerous characteristics and advantages of the present invention have been set forth in the foregoing description, together with details of the structure and function of the invention, the disclosure is illustrative only, and changes may be made in detail, especially in matters of shape, size and arrangement of parts within the principles of the invention to the fall extent indicated by the broad general meaning of the terms in which the appended claims are expressed.

What is claimed is:

1. A seismically-reinforced electrical enclosure comprising:

a base frame including a latticework of vertical corner sections and top and bottom cross members connected together to form an enclosure defining a first pair of opposing sides and a second pair of opposing sides, a top and a bottom; and a reinforcing subframe connected to and enclosed within the base frame, the subframe including first and second rectangular assemblies interconnecting the first pair of opposing sides and first and second horizontal straps parallel with the first pair of opposing sides and interconnecting the first and second rectangular assemblies;

wherein each of the first and second rectangular assemblies includes a top member parallel with the top of the base frame, a bottom member parallel with the bottom of the base frame, and two elongate members parallel with the corner sections of the base frame and interconnecting the top and bottom members, the two elongate members each including a recess for receiving one of the first and second horizontal straps; wherein the first and second horizontal straps interconnect the second pair of opposing sides and pass through the recesses in the elongate members; and wherein each elongate member includes a forward surface orthogonally disposed adjacent to a first side surface, a middle surface disposed orthogonally adjacent to the first side surface, a second side surface disposed orthogonally adjacent to the middle surface and substantially parallel with the first side surface, and a rear surface disposed orthogonally adjacent to the second side surface and substantially parallel with the middle surface, the second side surface including the recess.

2. The electrical enclosure of claim 1, wherein each top member lies adjacent one of the top cross members of the base frame, each bottom member lies adjacent one of the bottom cross members of the base frame, and each vertical member lies adjacent one of the corner sections of the base frame.

3. The electrical enclosure of claim 1, further including a door pivotally coupled to one side of one of the first pair of opposing sides, the door including a plurality of braces extending from the door such that when closed, the braces extend into the base frame, wherein the braces couple the base frame to the door to stiffen the base frame when the base frame is under load.

4. The electrical enclosure of claim 3, wherein the plurality of braces includes four braces, each brace disposed in a corner area of the door and including a first surface for coupling one of the cross members of the base frame and a second surface for coupling one of the corner sections of the base frame.

5. The electrical enclosure of claim 4, wherein the door further includes a door bar assembly, each of the four braces being connected to the door assembly.

6. The electrical enclosure of claim 4, wherein the door further includes a rectangular door bar assembly for stiffening the door, wherein each of the four braces is connected to the door bar assembly.

7. The electrical enclosure of claim 1, further including at least one side panel coupled to one side of the first or second pair of opposing sides, the side panel including a plurality of braces extending from the side panel into the base frame, the braces coupling the base frame to the side panel to stiffen the base frame when the base frame is under load.

8. The electrical enclosure of claim 1, further comprising at least one side panel including a door, coupled to one side of the first or second pair of opposing sides, the door including a plurality of braces extending into the base frame, the braces coupling the base frame to the door to stiffen the base frame when the base frame is under load.

9. The electrical enclosure of claim 1, further including four side panels, one of the side panels being a door coupled to one side of the first or second pair of opposing sides, the door including a plurality of braces extending into the base frame, the braces coupling the base frame to the door to stiffen the base frame when the base frame is under load.

10. An electrical enclosure, comprising:
   a base frame including a latticework of corner sections and top and bottom cross members connected together to form a rectangular framework defining a first pair of opposing sides and a second pair of opposing sides, a top and a bottom;
   a door pivotally coupled to one side of one of the first pair of opposing sides, the door including a plurality of diagonal braces, wherein each brace is disposed in a corner area of the door and includes a first surface for engaging one of the cross members of the base frame and a second surface for engaging one of the corner sections of the base frame extending from the door such that when closed the braces extend into one of the first pair of opposing sides of the base frame, the braces couple the base frame to the door to stiffen the base frame when the base frame is under load.

11. The electrical enclosure of claim 10, wherein the door further includes a door frame, each of the braces being connected to the door frame, and wherein the door frame extends parallel to the rectangular framework when the door is closed.

12. The electrical enclosure of claim 10, further comprising a reinforcing subframe connected to and enclosed within the base frame, the subframe including first and second rectangular sections interconnecting the first pair of opposing sides and first and second horizontal straps parallel with the first pair of opposing sides and interconnecting the first and second rectangular sections.

13. A seismically-reinforced electrical enclosure comprising:
   a base frame including a latticework of vertical corner sections and top and bottom cross members connected together to form an enclosure defining a first pair of opposing sides and a second pair of opposing sides, a top and a bottom;
   a reinforcing subframe connected to and enclosed within the base frame, the subframe including first and second rectangular assemblies interconnecting the first pair of opposing sides and first and second horizontal straps parallel with the first pair of opposing sides and interconnecting the first and second rectangular assemblies;
   a housing supported by the base frame, wherein a first side of the housing includes a door, and wherein two transverse members of the first and second rectangular assemblies extend substantially across the width of the first side.

14. An electrical enclosure according to claim 13, wherein a first one of the transverse members extends proximate a top of the housing and a second one of the transverse members extends proximate a bottom of the housing.

15. An electrical enclosure, comprising:
   an enclosure housing defining a first pair of opposing sides and a second pair of opposing sides, a top and a bottom, supports for the enclosure housing;
   first and second rectangular assemblies, wherein each of the rectangular assemblies includes a top member parallel with the top of the housing, a bottom member parallel with the bottom of the housing, and two elongate vertical members interconnecting the top and bottom members, wherein each of the two elongate members defines a recess;
   first and second horizontal connectors interconnecting the first and second rectangular assemblies and passing through the recesses in the elongate members, forming a reinforcing subframe;
   wherein each elongate member includes a forward surface orthogonally disposed adjacent to a first side surface, a middle surface disposed orthogonally adjacent to the first side surface, a second side surface disposed orthogonally adjacent to the middle surface and substantially parallel with the first side surface, and a rear surface disposed orthogonally adjacent to the second side surface and substantially parallel with the middle surface, the second side surface including the recess.

16. The electrical enclosure of claim 15, further including a door pivotally coupled to one side of the enclosure housing, the door including a plurality of braces extending from the door such that when closed, the braces extend into the housing, wherein the braces couple the housing to the door to stiffen the housing when under load.

17. The electrical enclosure of claim 16, wherein the plurality of braces includes four braces, each brace disposed in a corner area of the door and including a first surface for coupling a horizontal cross member of the housing and a second surface for coupling a vertical member of the housing.

18. The electrical enclosure of claim 15, further comprising at least one side panel including a door, pivotally coupled to one side enclosure and having a rectangular door receiving frame, the door including a plurality of braces extending into the door receiving frame, the braces coupling the door receiving frame to the door to stiffen the door receiving frame when under load.

19. A seismically-reinforced electrical enclosure comprising:
   a base frame including a latticework of corner sections and top and bottom cross members connected together to form an enclosure defining a first pair of opposing sides and a second pair of opposing sides, a top and a bottom; and
   a reinforcing subframe connected to and enclosed within the base frame, the subframe including first and second rectangular assemblies interconnecting the first pair of opposing sides and first and second horizontal straps parallel with the first pair of opposing sides and interconnecting the first and second rectangular assemblies;
   wherein each of the first and second rectangular assemblies includes a top member parallel with the top of the base frame, a bottom member parallel with the bottom of the base frame, and two elongate members parallel with the corner sections of the base frame and interconnecting the top and bottom members, the two elongate members each including a recess for receiving one of the first and second horizontal straps;
   wherein the first and second horizontal straps interconnect the second pair of opposing sides and pass through the recesses in the elongate members;
   and wherein each elongate member includes a forward surface orthogonally disposed adjacent to a first side surface, a middle surface disposed orthogonally adjacent to the first side surface, a second side surface disposed orthogonally adjacent to the middle surface and substantially parallel with the first side surface, and a rear surface disposed orthogonally adjacent to the second side surface and substantially parallel with the middle surface, the second side surface including the recess.

20. A reinforcing door assembly for an enclosure, comprising:
- a door receiving frame defining a rectangular opening, with a vertical frame member extending on either side of the opening;
- the door having a planar panel pivotally mounted to the door receiving frame, and having an outer face and an inner face with side edge portions extending inward from the inner face along the edges of the planar panel; and
- diagonal support portions, including a first diagonal support portion extending from an inner surface of each of the side edge portions to an upper edge of the door, and a second diagonal support portion extending from the inner surface of each of the side edge portions to a lower edge of the door.

21. A door assembly according to claim 20, wherein the diagonal support portions engage and provide support to the door receiving frame, when closed.

22. A door assembly according to claim 21, wherein the door includes a rectangular door frame engaging an inner surface of the door panel.

23. A door assembly according to claim 22, wherein the diagonal support portions engage both of the side edges at first and second spaced apart locations.

* * * * *